United States Patent [19]
Hausmann et al.

[11] Patent Number: 6,057,244
[45] Date of Patent: May 2, 2000

[54] METHOD FOR IMPROVED SPUTTER ETCH PROCESSING

[75] Inventors: Gilbert Hausmann, Ben Lomond; Vijay Parkhe, Sunnyvale; Chia-Ao Lu, Palo Alto; Michael S. Jackson, Sunnyvale, all of Calif.

[73] Assignee: Applied Materials, Inc., Santa Clara, Calif.

[21] Appl. No.: 09/126,886

[22] Filed: Jul. 31, 1998

[51] Int. Cl.[7] .................................................. H01L 21/00
[52] U.S. Cl. ........................ 438/706; 438/710; 438/711; 438/712; 438/716
[58] Field of Search .................................. 438/710, 711, 438/712, 714, 718, 719; 156/345, 646

[56] References Cited

U.S. PATENT DOCUMENTS

| | | | |
|---|---|---|---|
| 4,384,918 | 5/1983 | Abe | 156/643 |
| 4,963,713 | 10/1990 | Horiuchi et al. | 219/121.43 |
| 5,221,450 | 6/1993 | Hattori et al. | 204/192.32 |
| 5,272,417 | 12/1993 | Ohmi | 315/111.21 |
| 5,310,453 | 5/1994 | Fukasawa et al. | 156/643 |
| 5,431,799 | 7/1995 | Moseley et al. | 204/298.06 |
| 5,459,632 | 10/1995 | Birang et al. | 361/234 |
| 5,552,955 | 9/1996 | Mashiro et al. | 361/234 |
| 5,583,737 | 12/1996 | Collins et al. | 361/234 |
| 5,684,669 | 11/1997 | Collins et al. | 361/237 |
| 5,790,365 | 8/1998 | Shel | 361/234 |
| 5,869,401 | 2/1999 | Brunemeier et al. | 438/710 |

*Primary Examiner*—Felisa Garrett
*Assistant Examiner*—Lan Vinh
*Attorney, Agent, or Firm*—Thomason, Moser & Patterson

[57] ABSTRACT

Method for processing a semiconductor substrate in a chamber comprising the steps of establishing preprocess conditions in the chamber, executing a two-step plasma ignition, processing the substrate, executing a two-step plasma power down and executing a two-step substrate dechuck. A "softer" ignition of a plasma in two steps reduces DC bias spikes on the substrate. Reducing DC bias spikes reduces processing anomalies such as excess charge retention in the wafer after removing the chucking voltage and wafer repulsion and plasma discontinuity during processing. Additionally, the plasma ramp down after processing allows adequate time for discharging of residual charges in the wafer which allows for more reliable removal of the substrate from the chamber (dechucking).

21 Claims, 2 Drawing Sheets

METHOD FOR IMPROVED SPUTTER ETCH PROCESSING

BACKGROUND OF THE DISCLOSURE

1. Field of the Invention

The invention relates to semiconductor substrate processing, and more particularly, to a method for improved handling and processing of a semiconductor wafer in a sputter etch process system.

2. Description of the Background Art

Semiconductor processing typically is carried out in specialized apparatus comprised of multiple chambers wherein wafers are processed by the deposition and various treatments of multiple layers of semiconductor material in a single environment. The plurality of processing chambers and preparatory chambers are strategically arranged to process substrates (i.e., semiconductor wafers) through a plurality of sequential steps to produce integrated circuits.

Plasma-based reaction chambers have become increasingly utilized in such specialized apparatus, providing for precisely controlled thin-film etchings and depositions. For example, in an inductively coupled plasma source (IPS) sputter etch chamber, a plasma is used to initiate wafer processing conditions. In such a chamber, a pedestal supports an electrostatic chuck and also functions as an RF powered cathode. The chamber walls typically form an RF anode. The electrostatic chuck (e.g., a ceramic electrostatic chuck) creates an electrostatic attractive force to retain the wafer in a stationary position during processing. A voltage is applied to one or more electrodes imbedded within a ceramic chuck body so as to induce opposite polarity charges in the wafer and electrodes, respectively. The opposite charges pull the wafer against the chuck support surface, thereby electrostatically clamping the wafer.

An additional coil on the outside surface of the IPS chamber lid is energized with RF power that inductively couples through the lid and into the chamber. The electric field generated between the anode and cathode along with the inductively coupled power from coil ionizes a reactant gas introduced into the chamber to produce the plasma. Ions from the plasma bombard the wafer to create (etch) a desired pattern.

Electrically biasing the pedestal and wafer as a cathode enhances the wafer process; however, it also creates certain undesirable conditions afterwards. Particularly, wafers with relatively thick (e.g., 1 $\mu$m) oxide coatings will tend to accumulate charges during processing. The charges are primarily RF induced, and it is believed that they are trapped by the electrostatic chucking forces that retain the wafer. As such, the wafer is retained by the chuck to some degree even after the chucking voltage is removed. The wafer must then be mechanically forced from the pedestal which leads to breakage or particle formation; neither of which is desirable.

A second problem are the electrical transients that travel through the wafer (again as a result of the RF power). These transients cause the wafer to locally alter its bias thereby weakening or totally repelling the chucking force. Accumulated charges are detrimental because they reduce the available chucking force for retaining a wafer. This condition, in turn, results in poor process conditions. For example, a reduced chucking force can contribute to a non-uniform backside gas pressure under the wafer. Such unequal forces cause wafer shifting or pop-off and compromises temperature control which results in poor etch process conditions or particle contamination.

Therefore, a need exists in the art for a method of properly controlling the process parameters of a sputter etch wafer process to reduce the likelihood of residual charge retention in the substrate and allow for improved dechucking of same.

SUMMARY OF THE INVENTION

The disadvantages associated with the prior art are overcome with the present invention of a method for processing a semiconductor substrate in a chamber comprising the steps of establishing preprocess conditions in the chamber, executing a two-step plasma ignition, processing the substrate, executing a two-step plasma power down and executing a two-step substrate dechuck. Establishing the preprocess conditions consists of applying a chucking voltage to the substrate, flowing a backside gas at a flow rate of approximately 4 sccm for approximately 10 seconds to the substrate to establish a backside gas pressure, introducing a first flow of process gas at a flow rate of approximately 100 sccm, introducing a second flow of process gas at a flow rate of approximately 5 sccm and reducing the backside gas flow to approximately 1 sccm for approximately 5 seconds.

The two step plasma ignition consists of applying an RF bias power of approximately 200 Watts at a frequency of approximately 13.56 Mhz to the chamber and approximately 0.5 seconds later applying an RF coil power of approximately 300 Watts at a frequency of approximately 400 Khz to the chamber.

The RF bias power is then increased to approximately 300 Watts and the first flow of process gas is reduced to 0 sccm for approximately 60 seconds or other sufficent time to process the substrate (i.e., to achieve the desired oxide removal).

The two step plasma power down consists of increasing the RF coil power to approximately 500 Watts and reducing the backside gas flow to approximately 0 sccm for approximately 2 seconds. Then, the RF bias power is decreased to approximately 150 Watts for approximately 2 seconds. The two step substrate dechuck consists of decreasing the RF bias power to approximately 1 Watt for approximately 6 seconds and then reducing the chucking voltage to approximately 1 volt for approximately 5 seconds. The chamber can then be purged and byproducts pumped out so as to render the chamber environment suitable for another process run.

The benefits realized by this improved method are a "softer" ignition of a plasma which reduces the DC bias spikes on the substrate. Reducing DC bias spikes reduces processing anomolies such as excess charge retention in the wafer after removing the chucking voltage and wafer repulsion and plasma discontinuity during processing. Additionally, the plasma ramp down after processing allows adequate time for discharging of residual charges in the wafer which allows for more reliable removal of the substrate from the chamber (dechucking).

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
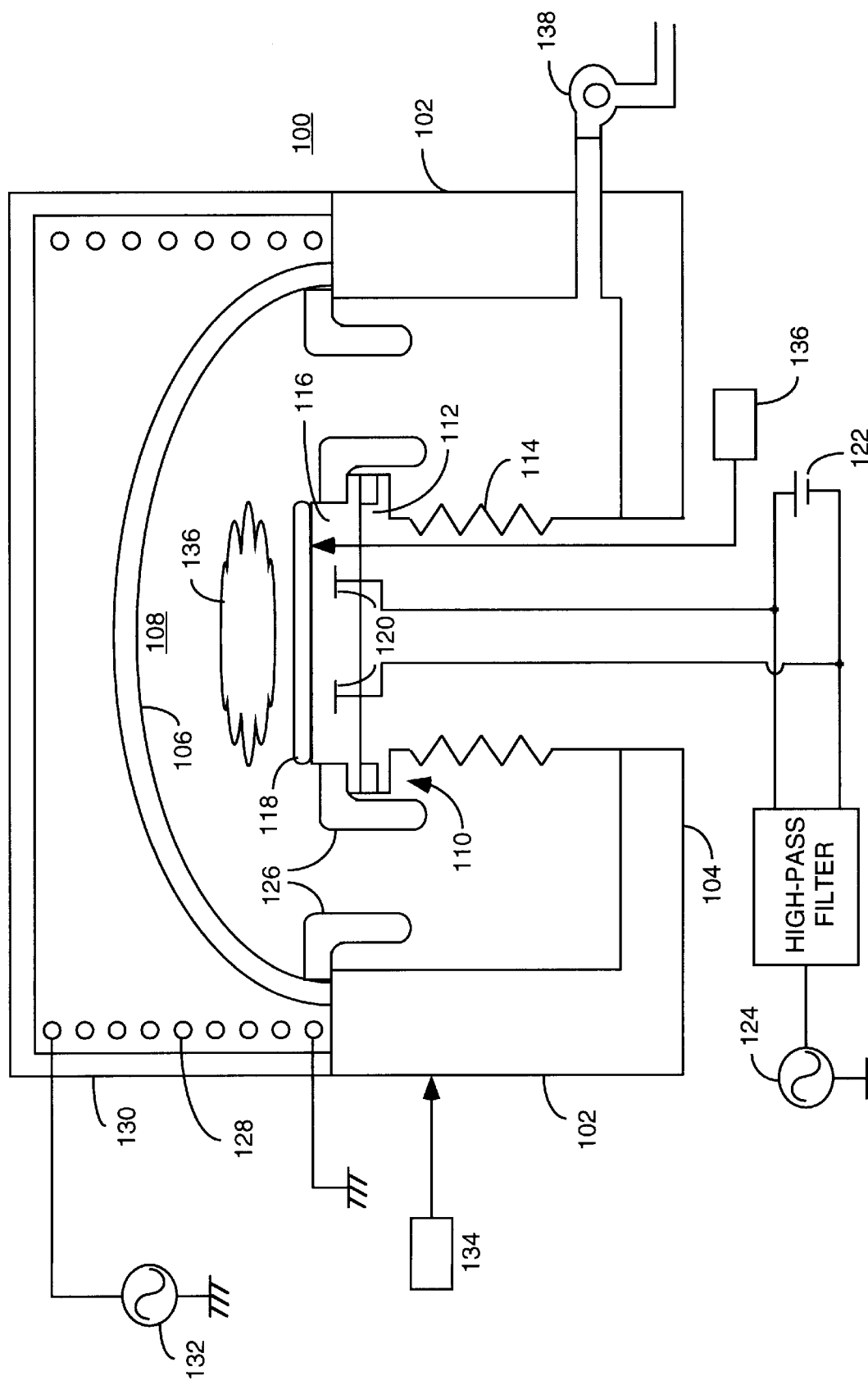
FIG. 1 depicts a process chamber within which the method of the present invention can be executed.

An improved method for processing of semiconductor wafer in a semiconductor wafer processing system is described. The method may be practiced, for example, in a sputter etch process chamber such as the Preclean II/e process chamber manufactured and sold by Applied Materials, Inc. of Santa Clara, Calif. Specifically, FIG. 1 depicts a schematic of a sputter etch process chamber 100 mentioned above. The chamber 100 comprises a plurality of walls 102 extending upwards from a base 104. A dome-shaped lid 106 encloses a process cavity 108 of the chamber 100. Within the cavity 108, a substrate support 110 is disposed for supporting and retaining a workpiece 118 such as semiconductor wafer. The substrate support 110 further comprises a pedestal 112 sheathed in a bellows assembly 114. The bellows assembly 114 allows for movement of the substrate support 110 within the process cavity 108 while maintaining a vacuum condition within the enclosure 108. An electrostatic chuck 116 is disposed on top of the pedestal 112 for retaining a workpiece 118 thereupon. The workpiece 118 is electrostatically retained by the electrostatic chuck by the one or more electrodes 120 connected to a chucking power supply 122 (e.g., a high-powered DC source). Additionally, the substrate support 110 functions as an RF cathode via connection to an RF power supply 124. The chamber comprises one or more deposition shields, cover rings or the like 126 circumscribing various chamber components to prevent unwanted reaction between such components and ionized process material.

To create the desired plasma for processing the substrate 118 an RF coil 128 is provided in the chamber 100. Specifically, the coil 128 is disposed within a resonator housing 130 disposed above the lid 106. The coil 128 is vertically aligned with the walls 102 of the chamber 100 and is powered by an RF coil power source 132. Process gas (e.g., argon) is introduced into the chamber 100 from a process gas source 134. A plasma 136 is created in the process cavity 108 when the RF coil inductively couples power from source 132 into the process gas in the chamber. A backside gas is also provided through the substrate support 110 to a backside of the wafer 118 via a backside gas source 136. The backside gas acts as a thermal conduction medium between the substrate support 110 and the wafer 118. To establish and maintain the necessary environmental conditions in the chamber 100, a pressure control device 138 is connected to the chamber 100. The pressure control device is for example a turbo pump or other similar pump capable of establishing near vacuum conditions (i.e., chamber pressure in the mTorr range).

Figure 2:
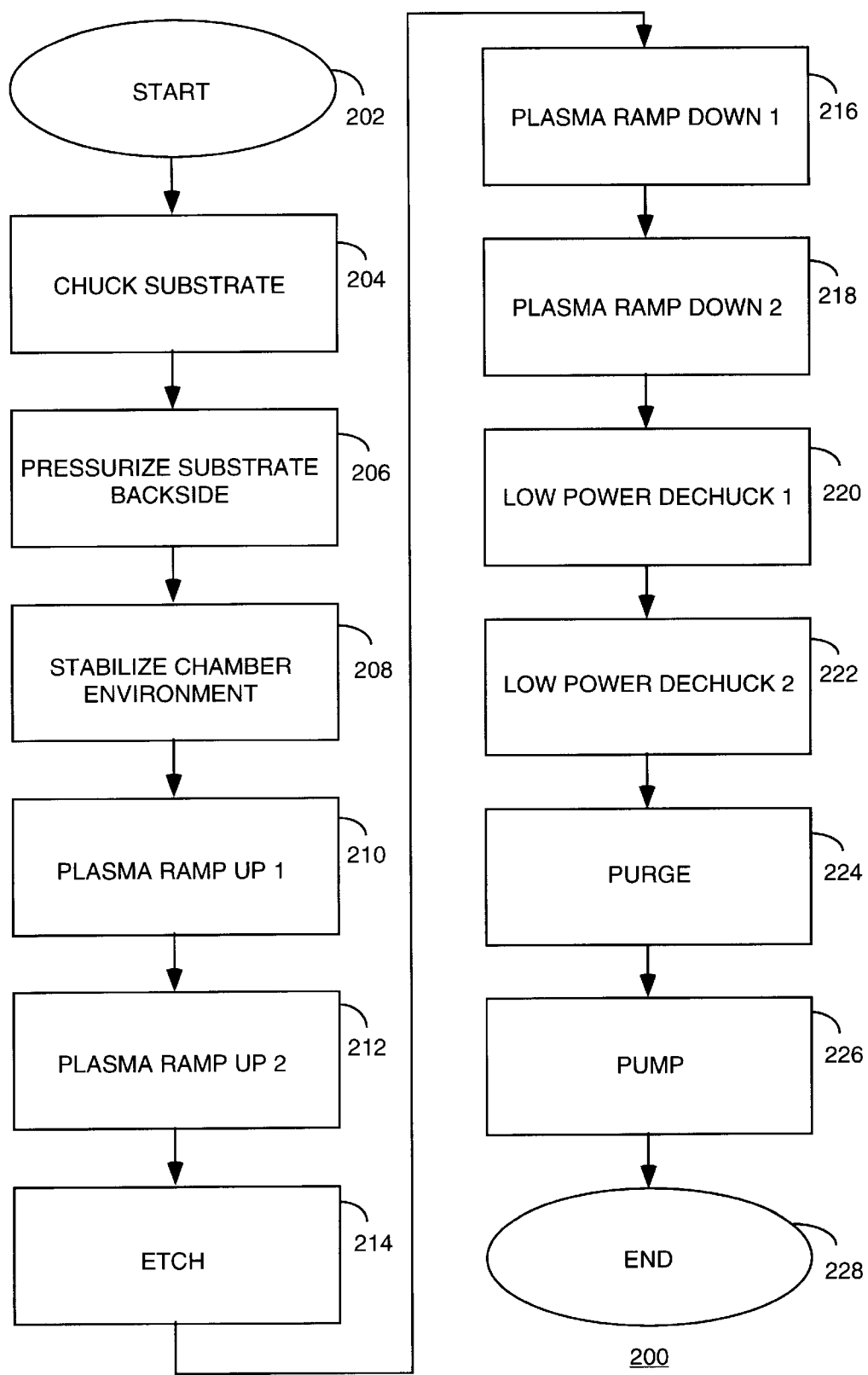
FIG. 2 is a flow chart of the method of the present invention.

FIG. 2 depicts a series of method steps 200 for controlling process conditions within the chamber 100. This method reduces the residual charges and hence the time required to dechuck a wafer as well as enhancing defect performance. Specifically, the method 200 starts at step 202 and proceeds to the next step, step 204 wherein a substrate (i.e., a semiconductor wafer) is chucked to a substrate support. The substrate support is, for example a ceramic electrostatic chuck which comprises one or more electrodes buried within a ceramic chuck body. The electrodes are energized by a power source which in turn creates a strong attractive force between the chuck and the substrate. In a preferred embodiment of the invention, a high voltage DC power source is used to create the appropriate chucking voltage and electrostatic force to retain the substrate on the chuck. Preferably the chucking voltage is approximately 250 volts DC.

After the substrate is properly retained upon the chuck in step 204, a backside gas is applied behind the substrate at step 206. The flow of gas to the backside of the substrate ensures a sufficient thermal energy transfer from the substrate to the chuck which is cooled by a variety of methods (i.e. water passing through conduits below the chuck surface). Preferably, the backside gas is an inert gas such as Argon applied to the backside of the wafer at a flow rate of approximately 4 sccm for approximately 10 seconds. Experimentation has revealed that the 10 second interval of backside gas results in a backside pressure of approximately 5 Torr. This value is considered sufficient for cooling of the substrate during process conditions while allowing for leakage.

After the pressurization step 206 the chamber environment is stabilized in step 208. Specifically, the stabilization step comprises introducing a first flow of a process gas for approximately 5 seconds to the chamber at a flow rate of approximately 100 sccm and a second flow of a process gas into the chamber at a rate of approximately 5 sccm for approximately 5 seconds. The first flow of process gas is used primarily for creating a high pressure condition necessary for plasma ignition and the second flow of process gas is used primarily for sustaining process conditions within the chamber as described in greater detail below. Additionally, the flow rate of the backside gas is reduced to approximately 1 sccm to maintain the backside gas pressure conditions discussed above. That is, once the substrate has been adequately chucked the backside gas pressure is sufficient for thermal transfer yet not enough to cause the wafer to shift, move or pop off the electrostatic chuck. However, some leakage may occur which will reduce the backside gas pressure below the 5 Torr value; therefore, the 1 sccm flow of backside gas compensates for any leakage.

After the chamber environment has been stabilized in step 208, a high pressure "soft" ignition of a plasma is executed. Specifically, a first plasma ramp up the step is executed at step 210. The first plasma ramp up step is executed by applying an RF bias to the electrostatic chuck. Specifically, an RF power of approximately 200 watts at a frequency of approximately 13.56 Mhz is applied to the electrostatic chuck via a power supply to bias the chuck to attract positive ions. After the first plasma ramp up step, a second plasma ramp up step 212 is executed. The second plasma ramp up step applies an RF power to a coil that is disposed on an outside of a lid enclosing the chamber to ionize the process gas into a plasma within the chamber. Specifically, the second plasma ramp up step occurs 0.5 seconds after the first plasma ramp up step by applying an RF power of approximately 300 watts at a frequency of 400 Khz to the coil. The RF power from the coil inductively couples through the lid to the process gas injected into the chamber during the stabilization step 208 and creates a plasma above the wafer which is suitable for processing (i.e. etching an oxide layer off the wafer to a depth of approximately 300–500 Å). The high pressure "soft" ignition represented by steps 210 and 212 minimize the interference of DC bias spikes on the electrostatic chuck surface.

Minimizing DC bias spikes interference is important because excessive spiking causes field emission between the chuck and the substrate. These field emissions induce extra charges in the substrate which become trapped and contribute to substrate sticking or residual chucking force after the chucking voltage power has been removed.

After the plasma has been ignited, process 200 continues at step 214 which is a standard etch process capable of removing an oxide layer from the substrate via an interaction between the oxide layer and the energetic molecules of the plasmolized process gas. For optimal etching conditions, a chamber pressure of 8 mT was set in the chamber by reducing the first process gas flow from approximately 100 sccm to 0 sccm while maintaining the second process gas flow at 5 sccm, maintaining the backside gas flow at 1 sccm, increasing the RF bias power to approximately 300 watts and maintaining the RF coil power at approximately 300 watts. In a preferred embodiment of the invention, the etch step 214 is carried out for approximately 60 seconds.

After the intended etch step has been completed, the substrate (i.e. semiconductor wafer) is dechucked and removed from the chamber. In order to properly dechuck the wafer however, a two step plasma ramp down must be executed in order to discharge any residual charges that remain in the wafer. Specifically at step 216, a first plasma ramp down step is executed wherein the RF coil power is increased to approximately 500 watts while maintaining the RF bias power at approximately 300 watts and reducing the backside gas flow to 0 sccm for a period of approximately 2 seconds. After the first plasma ramp down step 216 has been executed, a second plasma ramp down step 218 is executed. Specifically, the second plasma ramp down step is executed by maintaining the RF coil power at 500 watts and reducing the RF bias power to approximately 150 watts for a period of approximately 2 seconds. Reducing the backside gas flow reduces the upward force applied to the substrate via the pressurized gas. Increasing the RF coil power serves to sustain the plasma and thereby pull the excess charges within the wafer towards the grounded chamber walls hence reducing the DC bias on the wafer. Reducing the RF bias power at step 218 reduces the amount of ion bombardment and subsequently the amount of heat imparted to the wafer. Additionally, there is a lesser likelihood of residual charges building up in the wafer which further lowers the DC bias. The combination of reduced DC bias and residual charges on the wafer and lower backside gas pressure insures safe reliable dechucking of the wafer without unusual or unexpected movement of the wafer during removal from the chamber.

After the first and second plasma ramp down steps 216 and 218 respectively, a first low power dechucking step 220 is executed. Specifically, the RF bias power is reduced from 150 watts to approximately 1 watt where ionic bombardment is reduced to nearly zero and any residual charges can be further removed from the wafer. Additionally, the backside gas is pumped off the wafer backside to eliminate any remaining upward force. This first low power dechucking step 220 is executed for approximately 6 seconds. Next a second low power dechuck step 222 is executed. Specifically, the RF bias power and RF coil power are maintained at 1 watt and 500 watts respectively and the chucking voltage is reduced from approximately 250 volts to approximately 1 volt for a period of approximately 5 seconds. At this point mostly all residual charges and backside gas pressure have been removed and the wafer can be removed from the chamber via typical mechanical means such as a robot transfer arm extending into the chamber.

After the second low power dechucking step 222, a chamber purge step 224 is executed. Specifically, an inert gas is flowed into the chamber at a rate of approximately 25 sccm and both the RF bias power and RF coil power are turned down to 0 watts for approximately 5 seconds. This purge step allows residual process gas particles to be stirred up within the chamber and subsequently pumped out at pump step 226. Specifically, pump step 226 is executed for approximately 5 seconds wherein the inert process gas flow is shut off and a chamber pressure control device (i.e. a turbo pump) is activated. The pump pulls out the residual process gas particles as well as the inert purge gas so that the process can be started anew under nearly identical conditions as when the process was first started. That is to say, for maximum reliability and repeatability of a certain process, all conditions before, during and after the specific process should be identical or close thereto within a batch run of wafers.

Although various embodiments which incorporate the teachings of the present invention have been shown and described in detail herein, those skilled in the art can readily devise many other varied embodiments that still incorporate these teachings.

What is claimed is:

1. Method for processing a semiconductor substrate in a chamber comprising the steps of:
   (a) establishing preprocess conditions in the chamber;
   (b) executing a two-step plasma ignition;
   (c) processing the substrate;
   (d) executing a two-step plasma power down; and
   (e) executing a two-step substrate dechuck.

2. The method of claim 1 wherein step (a) further comprises:
   (i) chucking the substrate;
   (ii) flowing a backside gas to the substrate to establish a backside gas pressure; and
   (iii) stabilizing an atmosphere in the chamber.

3. The method of claim 2 wherein step (i) further comprises applying a chucking voltage of approximately 250 volts to a substrate support within the chamber.

4. The method of claim 2 wherein step (ii) further comprises flowing the backside gas at a flow rate of approximately 4 sccm for approximately 10 seconds.

5. The method of claim 2 wherein step (iii) further comprises:
   introducing a first flow of process gas at a flow rate of approximately 100 sccm;
   introducing a second flow of process gas at a flow rate of approximately 5 sccm; and
   reducing the backside gas flow to approximately 1 sccm for approximately 5 seconds.

6. The method of claim 1 wherein step (b) further comprises applying an RF bias power and an RF coil power to the chamber.

7. The method of claim 6 wherein the RF bias power is approximately 200 Watts at a frequency of approximately 13.56 Mhz and the RF coil power is approximately 300 Watts at a frequency of approximately 400 Khz.

8. The method of claim 6 wherein the RF coil power is applied approximately 0.5 seconds after the RF bias power is applied.

9. The method of claim 7 wherein step (c) further comprises increasing the RF bias power to approximately 300 Watts and reducing the first flow of process gas to approximately 0 sccm for approximately 60 seconds.

10. The method of claim 7 wherein step (d) further comprises increasing the RF coil power to approximately 500 Watts and reducing a backside gas flow to approximately 0 sccm for approximately 2 seconds.

11. The method of claim 10 wherein step (d) further comprises decreasing the RF bias power to approximately 150 Watts for approximately 2 seconds.

12. The method of claim 7 wherein step (e) further comprises decreasing the RF bias power to approximately 1 Watt for approximately 6 seconds.

13. The method of claim 12 wherein step (e) further comprises reducing the chucking voltage to approximately 1 volt for approximately 5 seconds.

14. The method of claim 1 further comprising the steps of:
(f) purging the chamber; and
(g) pumping the chamber.

15. The method of claim 14 wherein step (f) further comprises flowing a purge gas into the chamber at a flow rate of approximately 25 sccm for approximately 5 seconds.

16. The method of claim 15 wherein the purge gas is Argon.

17. The method of claim 14 wherein the chamber is pumped for approximately 5 seconds.

18. Method for processing a semiconductor substrate in a chamber comprising the steps of:
(a) chucking the substrate;
(b) flowing a backside gas to the substrate at a flow rate of approximately 4 sccm for approximately 10 seconds;
(c) introducing a first flow of process gas to the chamber at a flow rate of approximately 100 sccm;
(d) introducing a second flow rate of a process gas to the chamber at a flow rate of approximately 5 sccm;
(e) reducing the backside gas flow to approximately 1 sccm for approximately 5 seconds;
(f) applying an RF bias power to the chamber of approximately 200 watts at a frequency of approximately 13.56 Mhz and applying an RF coil power approximately 0.5 seconds after applying the RF bias power, the RF coil power being approximately 300 watts at a frequency of approximately 400 Khz;
(g) increasing the RF bias power to approximately 300 watts and reducing the first flow of process gas to approximately 0 sccm;
(h) processing the substrate;
(i) increasing the RF coil power to approximately 500 watts and reducing a backside gas flow to approximately 0 sccm for approximately 2 seconds;
(j) decreasing the RF bias power to approximately 150 watts for approximately 2 seconds;
(k) decreasing the RF bias power to approximately 1 watt for approximately 6 seconds;
(l) reducing the chucking voltage to approximately 1 volt for approximately 5 seconds;
(m) flowing a purge gas into the chamber at a flow rate of approximately 25 sccm for approximately 5 seconds; and
(n) pumping the chamber for approximately 5 seconds.

19. The method of claim 18 wherein step (c) is conducted for approximately 5 seconds.

20. The method of claim 18 wherein step (h) is conducted for approximately 60 seconds.

21. Method for processing a semiconductor substrate in a chamber comprising the steps of:
(a) establishing preprocess conditions in the chamber;
(b) executing a two-step plasma ignition in which bias power is applied to an electrostatic chuck and coil power is applied to a coil;
(c) processing the substrate;
(d) executing a two-step plasma power reduction in which the coil power is increased and the bias power is decreased; and
(e) executing a two-step substrate dechuck in which the bias power is decreased and a chucking voltage applied to the electrostatic chuck is reduced.

* * * * *